United States Patent
Wilcox

(10) Patent No.: US 7,009,460 B2
(45) Date of Patent: Mar. 7, 2006

(54) METHOD AND APPARATUS FOR REDUCING THE START TIME OF A VCXO

(75) Inventor: Bruce Wilcox, Cary, NC (US)

(73) Assignee: Sony Ericsson Mobile Communications AB, (SE)

( * ) Notice: Subject to any disclaimer, the term of this patent is extended or adjusted under 35 U.S.C. 154(b) by 33 days.

(21) Appl. No.: 10/895,696

(22) Filed: Jul. 21, 2004

(65) Prior Publication Data

US 2006/0017518 A1 Jan. 26, 2006

(51) Int. Cl.
*H03B 5/06* (2006.01)
*H03B 5/36* (2006.01)

(52) U.S. Cl. .................. 331/173; 331/158; 331/177 V; 331/185

(58) Field of Classification Search .............. 331/36 C, 331/108 C, 116 R, 116 FE, 117 R, 117 FE, 331/117 D, 158, 173, 177 R, 177 V, 185–186
See application file for complete search history.

(56) References Cited

U.S. PATENT DOCUMENTS

| | | | |
|---|---|---|---|
| 5,534,826 A | * | 7/1996 | Logan ........................ 331/158 |
| 5,844,448 A | | 12/1998 | Jackoski et al. |
| 2002/0171500 A1 | | 11/2002 | Eichi et al. |

FOREIGN PATENT DOCUMENTS

| | | | |
|---|---|---|---|
| EP | 0 709 965 | | 5/1996 |
| JP | 03155206 | * | 7/1991 |

OTHER PUBLICATIONS

Wessendorf, Kurt and Payne, Tom,; "Oscillator Design Techniques Allow High Frequency Applications of Inverted Mesa Resonators," www.sss-mag.com/pdf/saosc.pdf.
Jackson, Said, "VCXO makes inexpensive dual-clock reference," EDN, Nov. 27, 2003, pp. 92, 94, 96.
PCT International Search Report; International Application No. PCT/US2005/002493 mailed Jun. 29, 2005.

* cited by examiner

*Primary Examiner*—David Mis
(74) *Attorney, Agent, or Firm*—Coats & Bennett, P.L.L.C.

(57) ABSTRACT

A voltage controlled oscillator, such as a VCXO (Voltage Controlled Crystal Oscillator), for generating a desired reference frequency in a wireless terminal with a reduced start-up time is described herein. According to the present invention, the VCXO comprises an oscillator that generates the desired reference frequency based on a variable voltage applied to the oscillator by a voltage controller. In addition, the VCXO includes a start-up controller that applies a bias voltage to an oscillator input node to reduce a capacitance associated with the oscillator, and therefore, to reduce the start-up time without negatively impacting the DC current consumption or the tuning range of the VCXO.

44 Claims, 4 Drawing Sheets

METHOD AND APPARATUS FOR REDUCING THE START TIME OF A VCXO

BACKGROUND OF THE INVENTION

The present invention relates generally to frequency generators and more particularly to voltage controlled oscillators used in wireless terminals.

Wireless terminals typically include one or more frequency generators, such as a PLO (Phase Lock Oscillator), a VCO (Voltage Controlled Oscillator), and/or a VCXO (Voltage Controlled Crystal Oscillator), to provide clock signals and a reference frequency necessary for operation of the wireless terminal. A VCXO, which is a crystal-controlled oscillator that varies a frequency in direct proportion to an applied control voltage, typically provides the primary reference frequency for a wireless terminal. VCXOs typically have three inter-related operating parameters: tuning range, DC current consumption, and start-up time. The tuning range represents the difference between the maximum VCXO frequency and the minimum VCXO frequency. A typical tuning range for a VCXO is ±30 ppm. The DC current consumption is the amount of DC current consumed by the VCXO during operation. Typically, a VCXO consumes approximately 10 mA. The start-up time denotes the time required for the VCXO output voltage to reach approximately 90% of the final VCXO output voltage amplitude. Typical worst cast start-up times range from 4 to 5 msec.

Generally, the goal of the VCXO design engineer is to maximize the tuning range while minimizing DC current consumption and start-up time. However, the inter-relation of these three operating parameters makes this goal difficult to achieve. To understand the design trade-offs resulting from the inter-relation of these operating parameters, consider the following. A frequency generated by a VCXO is proportional to a reverse bias voltage applied to a variable load capacitance of the VCXO. The ratio of the minimum reverse bias voltage capacitance to the maximum reverse bias voltage capacitance determines the tuning range. As a result, large capacitance ratios maximize the tuning range.

However, because a large capacitance ratio typically results from a large minimum reverse bias voltage capacitance, and because the start-up time is proportional to the minimum reverse bias voltage capacitance, a large capacitance ratio also results in a large start-up time. Therefore, in order to achieve a desired tuning range, a VCXO may have an undesirably long start-up time.

Conventional VCXO designs may reduce this large start-up time by exploiting the fact that the start-up time decreases with increasing bias current. However, large bias currents result in high DC current consumption. As a result, while an increased bias current may produce a more desirable start-up time, the resulting DC current consumption undesirably reduces the life of the battery associated with the VCXO.

SUMMARY OF THE INVENTION

The present invention comprises a method and apparatus for reducing a start-up time associated with an oscillator circuit, such as a voltage controlled oscillator. An exemplary voltage controlled oscillator of the present invention comprises an oscillator that generates a reference frequency based on a variable voltage applied by a voltage controller to the oscillator. In addition, the exemplary voltage controlled oscillator includes a start-up controller that senses when the voltage controlled oscillator has been powered on. Once the start-up controller determines that the voltage controlled oscillator has been powered on, the start-up controller applies a temporary bias voltage to an input node of the oscillator to reduce a capacitance associated with the oscillator, and therefore, to reduce the start-up time. While applying the temporary bias voltage to the oscillator input node, the start-up controller monitors the oscillator output voltage. Once the start-up controller detects that the oscillator output voltage meets or exceeds a threshold, the start-up controller removes the bias voltage to enable the oscillator circuit to generate a desired reference frequency.

DETAILED DESCRIPTION OF THE INVENTION

Figure 1:
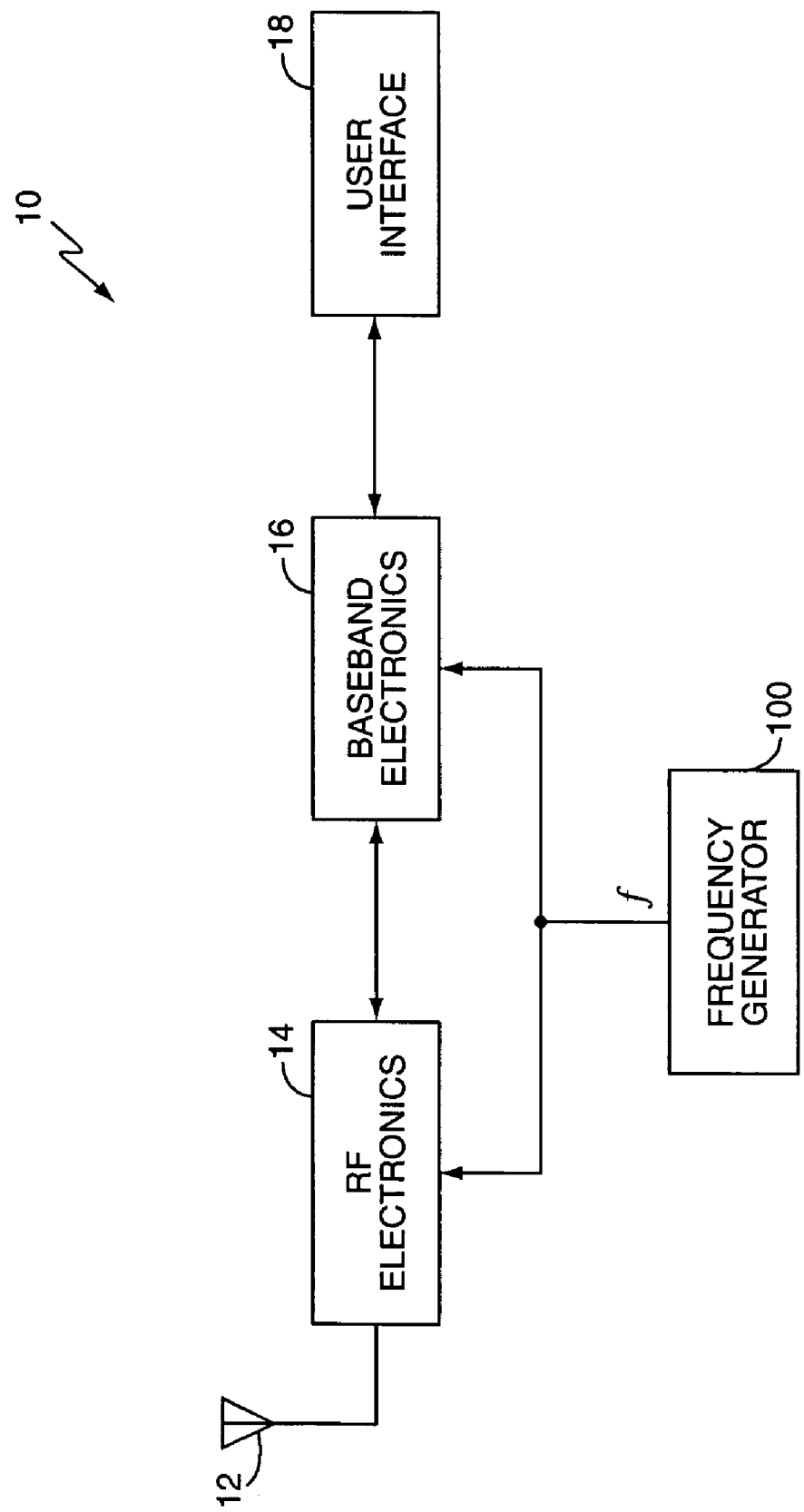
FIG. 1 illustrates a block diagram of a mobile terminal utilizing an exemplary VCXO according to the present invention.

FIG. 1 illustrates an exemplary wireless terminal 10 for use in a wireless communication network. As used herein, the term "wireless terminal" includes cellular telephones, satellite telephones, personal communication services (PCS) devices, personal data assistants (PDAs), palm-top computers, laptop computers, pagers, and the like.

Terminal 10 comprises an antenna 12, RF (Radio Frequency) electronics 14, baseband electronics 16, a user interface 18, and a frequency generator 100. RF electronics 14 include a transmitter and a receiver for transmitting and receiving wireless communication signals, respectively, via antenna 12 according to a predefined communication standard. Further, RF electronics 14 may include filters, mixers, converters, etc., for processing the RF signal for transmission or after reception. Baseband electronics 16 include a microprocessor, memory, and other electronics for processing signals provided by the user interface 18 for transmission by RF electronics 14. Further, baseband electronics 16 process signals provided by RF electronics 14 to convey information received by antenna 12 to a user via the user interface 18.

Wireless terminal 10 operates according to a predefined communication standard, such as Global System for Mobile Communications (GSM), Universal Mobile Telecommunication System (UMTS), TIA/EIA-136, Code Division Multiple Access (CDMA), cdmaOne, cdma2000, and Wideband CDMA, etc. Each standard uses a predefined range of frequencies to generate and process wireless communication signals transmitted over a wireless interface. In order for the wireless terminal 10 to operate according to a particular communication standard, frequency generator 100 provides a reference frequency (f) associated with the particular communication standard to the RF and baseband electronics 14, 16. The provided frequency serves not only as a reference frequency for the wireless terminal 10, but also serves as a clock source for various electronic components within the wireless terminal 10, such as a microprocessor, an ASIC (Application Specific Integrated Circuit), etc.

Figure 2:
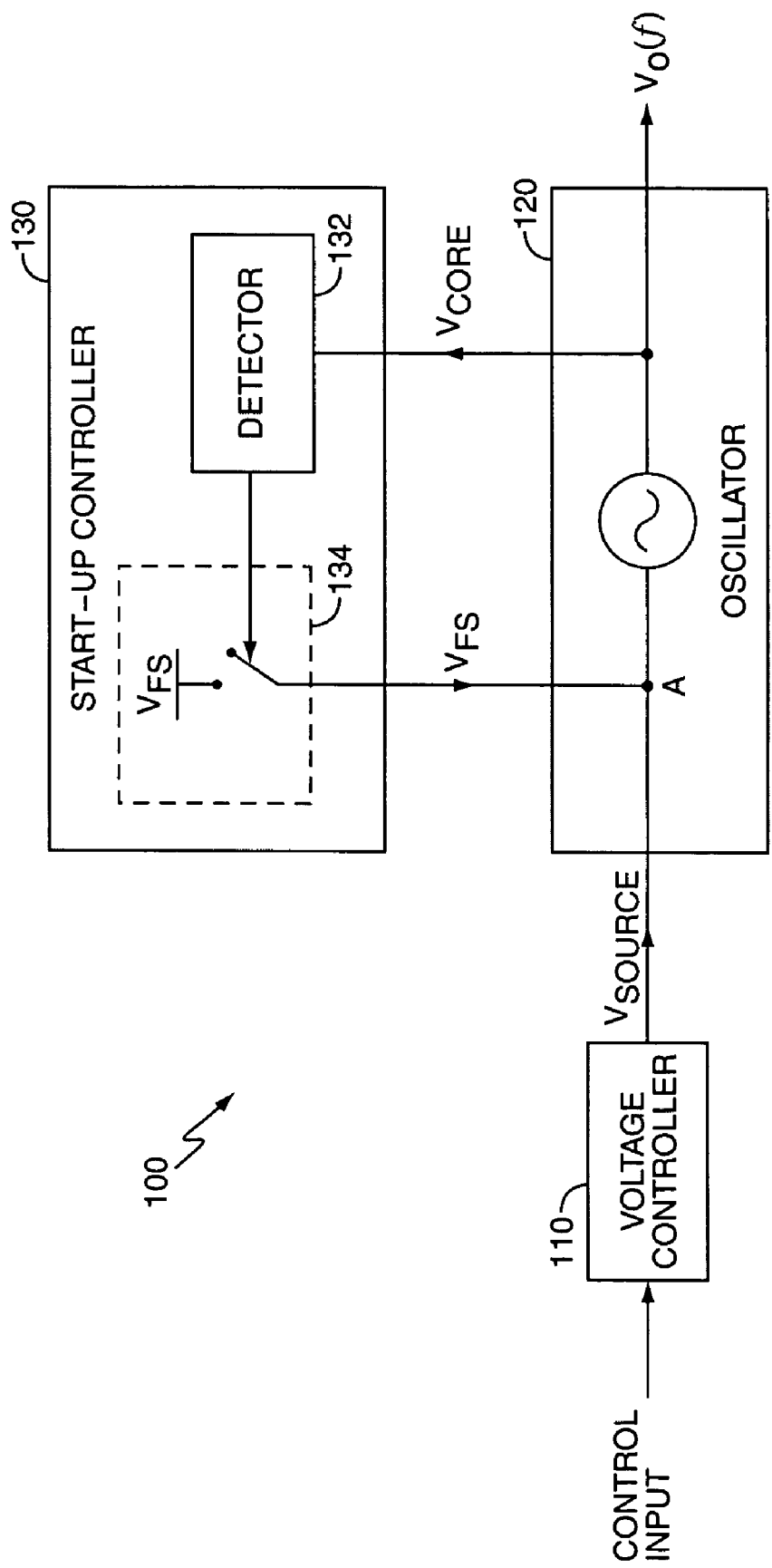
FIG. 2 illustrates an exemplary block diagram of a VCXO system according to the present invention.

A wireless terminal 10 typically uses a VCXO (Voltage Controlled Crystal Oscillator) 100 as the primary frequency generator. While the present invention is described in terms of VCXO 100, those skilled in the art will appreciate that the present invention may be applied to any known oscillator circuit. FIG. 2 illustrates a block diagram of an exemplary VCXO 100. VCXO 100 comprises a voltage controller 110, an oscillator 120, and a start-up controller 130. When VCXO 100 is powered on, a small reverse bias voltage close to 0 V is applied to the oscillation input node A. Once in steady state, oscillator 120 provides the wireless terminal 10 with a reference frequency necessary to generate a clock signal. Using the newly provided clock signal, wireless terminal 10 activates various electronic components to enable the full operation of the wireless terminal 10.

Once a clock signal has been provided, voltage controller 110 begins applying a variable source voltage ($V_{source}$) to the oscillator input node A so that oscillator 120 may generate an oscillator output voltage that oscillates at a desired reference frequency. As understood by those skilled in the art, the variable source voltage applied to oscillator input node A varies a capacitance of the oscillator 120, which causes the frequency generated by oscillator 120 to shift to the desired reference frequency.

As discussed above, the reverse bias voltage applied to the oscillator input node A at power up is close to 0 V. As a result, the initial capacitance of oscillator 120 is at a maximum capacitance (the minimum reverse bias voltage capacitance), which results in a maximum start-up time for the VCXO 100. Conventional VCXOs may reduce the start-up time by reducing the minimum reverse bias voltage capacitance. However, reducing the minimum reverse bias voltage capacitance may undesirably affect the tuning range of the VCXO. Alternatively, a conventional VCXO may reduce the start-up time by increasing the bias current. However, increasing the bias current may undesirably affect the DC current consumption. As such, these options undesirably affect the performance of the VCXO and/or the wireless terminal.

The VCXO 100 of the present invention includes a start-up controller 130 that reduces the VCXO start-up time without negatively impacting the tuning range or the DC current consumption of the VCXO 100. To that end, start-up controller 130 comprises a start-up detector 132 and a fast start network 134. Start-up detector 132 comprises a detection system, which may be implemented in hardware, software, or any combination of hardware or software, that senses when VCXO 100 has been powered on. Further, after the VCXO 100 is powered on, detector 132 monitors the amplitude of the oscillator output voltage ($V_o$) by comparing the oscillator output voltage to a threshold. The threshold used by detector 132 may be a fixed or variable threshold, and is typically derived from the operating conditions of the oscillator 120. For example, the threshold may be based on a maximum oscillator output voltage. In a preferred embodiment, the threshold may be set to a percentage, such as 90%, of the oscillator output voltage.

In any event, when detector 132 senses that the oscillator output voltage is below the threshold, detector 132 closes switch 136 in fast start network 134 to apply a fast start voltage ($V_{FS}$) to oscillator input node A. By applying $V_{FS}$ to oscillator input node A, start-up controller 130 reduces the initial capacitance of oscillator 120, which in turn reduces the start-up time. As long as the oscillator output voltage remains below the threshold, fast start network 134 will continue to apply VFS to oscillator input node A to minimize the capacitance of oscillator 120. However, once the oscillator output voltage meets or exceeds the threshold, detector 132 determines that oscillator 120 has reached steady state and disconnects the fast start voltage from the oscillator input node A. Once disconnected from start-up connector 130, oscillator 120 generates a desired reference frequency based on the source voltage provided by voltage controller 110 according to any means known in the art.

Figure 3:
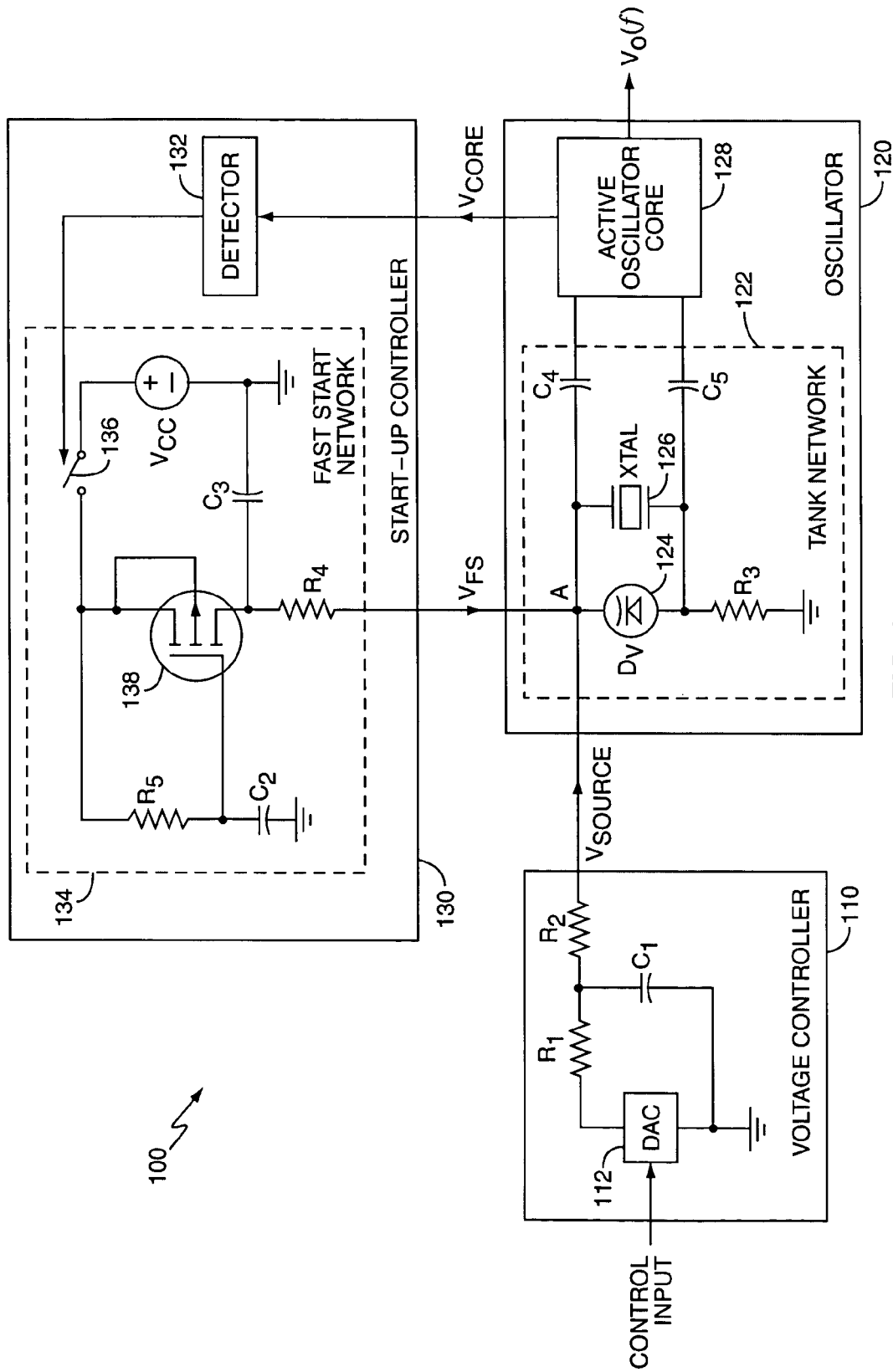
FIG. 3 illustrates a schematic of an exemplary VCXO system according to the present invention.

FIG. 3 illustrates a schematic for implementing an exemplary embodiment of VCXO 100. In the exemplary VCXO 100 of FIG. 3, oscillator 120 comprises a tank network 122 and an active oscillator core 128. Tank network 122 comprises a variable capacitor network, including varactor diode ($D_V$) 124, and a crystal resonator (XTAL) 126 that sets the reference frequency generated by oscillator 120 based on the magnitude of the source voltage applied to varactor diode 124. In general, tank network 122 is a feedback circuit for the active oscillator core 128 that shifts the reference frequency generated by oscillator 120 in response to the source voltage applied by voltage controller 110 to the cathode (oscillator input node A) of varactor diode 124.

Voltage controller 110 comprises a Digital-to-Analog Converter (DAC) 112 connected to an impedance network, such as the impedance network defined by $R_1$, $R_2$, and $C_1$. DAC 112 converts a received digital control signal into an analog DC voltage. The digital control signal input to DAC 112 may be, for example, a hexadecimal command word between 000 and 3FF, where 000 corresponds to a minimum source voltage, e.g., 0.3 V, and 3FF corresponds to a maximum source voltage, e.g., 2.6 V. In any event, the control signal defines the source voltage required by oscillator 120 to generate a particular reference frequency. The control signal may also define a source voltage that corrects a frequency error identified by the wireless terminal 10 or an associated terminal in the wireless communication network, such as a base station.

To reduce the start-up time, the fast start network 134 of start-up controller 130 may be implemented as shown in FIG. 3. In the embodiment shown in FIG. 3, fast start network 134 comprises a supply voltage VCC, a switch 136, and a p-channel field effect transistor (PFET) 138. While the following describes the fast start network 134 in terms of a PFET, those skilled in the art will appreciate that other types of transistors may also be used to implement the present invention.

When detector 132 senses that VCXO 100 has powered on, detector 132 closes switch 136 to connect VCC to the PFET 138. This action turns on PFET 138 and provides a fast start voltage ($V_{FS}$), derived from VCC, to the cathode of varactor diode 124. To minimize the voltage drop between VCC and the cathode of varactor diode 124, and therefore to minimize the varactor diode capacitance by maximizing $V_{FS}$, the resistance ratio $R_4/(R_1+R_2)$ is designed to be small (<0.1). For the embodiment of FIG. 3, $R_4$ is selected to provide the best compromise between a minimum VCC voltage drop across $R_4$ and a maximum tank network "Q" (for good phase noise performance).

A typical value for VCC is approximately 2.85 V, after regulation. Therefore, depending on the impedance of PFET 138 and $R_4$, closing switch 136 may apply up to 2.85 V to the cathode of varactor diode 124, which significantly reduces the varactor diode capacitance. The end result is an oscillator 120 having a lower initial capacitance, and therefore, a reduced start-up time. Preliminary tests indicate that start-up times less than 1 msec may be achieved with the VCXO 100 of the present invention, which represents a 4–5 times improvement over the start-up times of conventional VCXOs.

Because a reverse biased varactor diode 124 and crystal resonator 126 represent an open circuit at DC, any current provided by start-up controller 130 must be dissipated by another electrical path in the VCXO 100. A simple return path, such as a shunt resistor (not shown) connected to the varactor diode cathode may be used to sink the current generated by fast start network 134. However, such a shunt resistor adds another connection point to the tank network 122, which negatively impacts the "Q" of the tank network 122, and therefore, the performance of VCXO 100. Instead, the start-up controller 130 of the present invention may override the voltage controller 110 during the start-up time to use the voltage controller 110 as a current sink for bias current supplied by the start-up controller 130. For example, an exemplary return path for the current generated by the start-up controller 130 of the present invention may go through an output transistor stage of DAC 112 in voltage controller 110.

Because the voltage controller 110 sinks the bias current generated by start-up controller 130, it is important to disable the start-up controller 130 once the oscillator output voltage meets or exceeds the threshold to prevent the start-up controller 130 from interfering with the normal operation of the VCXO 100. As discussed above, detector 132 may disable the start-up controller 130 by disconnecting switch 136 once the detector 132 senses that the oscillator output voltage meets or exceeds the threshold. Further, the start-up controller 130 illustrated in FIG. 3 may also be designed to automatically disable PFET 136 after a predetermined time has elapsed. As understood by those skilled in the art, an RC time constant based on $R_5$ and $C_2$ defines the time it takes $C_2$ to fully charge. Because $C_2$ is connected to the gate of PFET 138, PFET 138 will remain "on" as long as the voltage across $C_2$, and therefore the gate voltage of PFET 138, is less than the gate-source voltage threshold of PFET 138. However, once the voltage across $C_2$ meets or exceeds the gate-source voltage threshold, PFET 138 is turned off. When turned off, PFET 138 represents an open circuit that effectively disconnects the supply voltage VCC from the tank network 122. Therefore, the impedance values of $R_5$ and $C_2$ may be selected to define a time limit for providing the fast start voltage to the tank network 122. In summary, the start-up controller 130 of FIG. 3 may be disabled either when detector 132 determines that the oscillator output voltage meets or exceeds the threshold or when a predetermined time period elapses, whichever occurs first.

Figure 4:
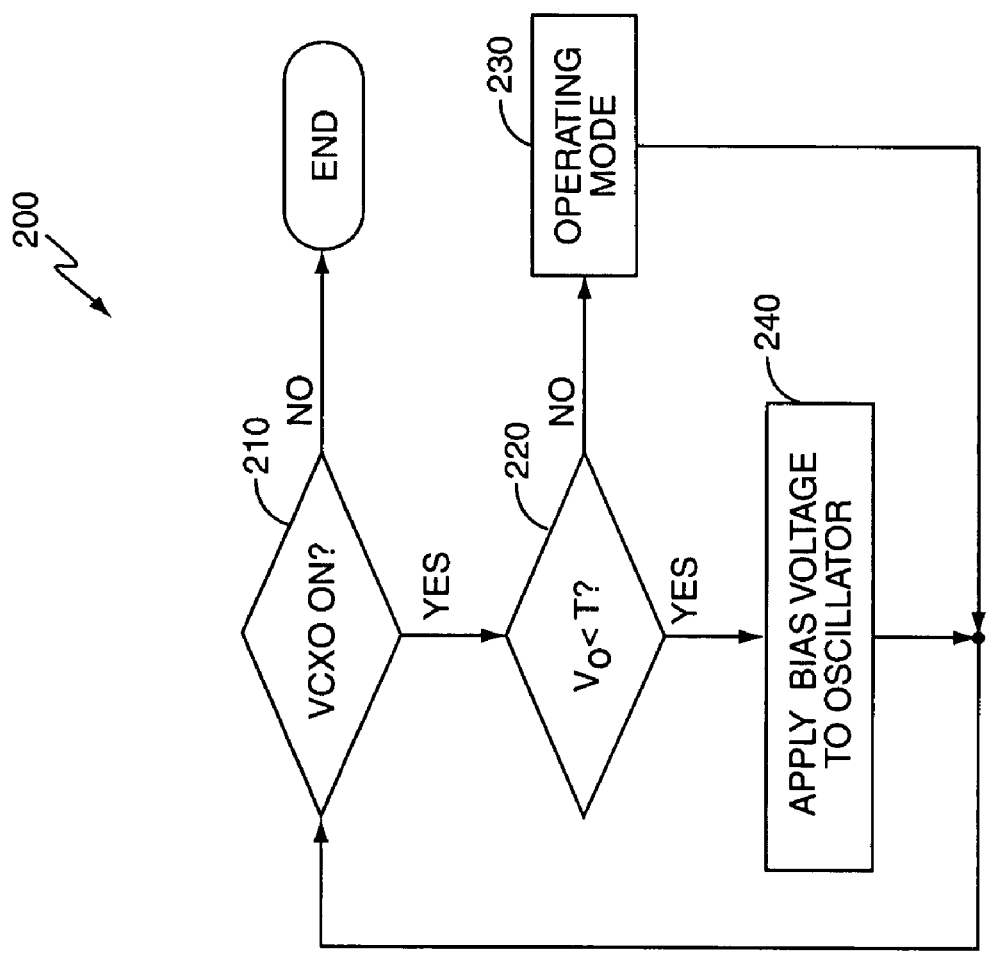
FIG. 4 illustrates an exemplary method according to the present invention.

FIG. 4 illustrates a flow chart that further describes an exemplary method 200 for reducing the VCXO start-up time of the present invention. According to the exemplary method 200, each time VCXO 100 is powered on (block 210), such as when wireless terminal 10 is powered on or when wireless terminal 10 wakes up from a sleep mode, detector 132 determines if the oscillator output voltage is less than a threshold (block 220). If the oscillator output voltage is less than the threshold, then start-up controller 130 applies VFS to the oscillator input node A (block 240). However, if the oscillator output voltage meets or exceeds the threshold, then start-up controller 130 is disabled and VCXO 100 enters a normal operating mode to generate the desired frequency for wireless terminal 10 (block 230). As long as VCXO 100 is powered on (block 210), detector 132 will continue to monitor the oscillator output voltage of (block 220). However, when VCXO 100 is turned off, the process ends.

The above describes a method and apparatus that reduces the start-up time associated with a VCXO 100 in a wireless terminal 10 by reducing a capacitance associated with oscillator 120 after the VCXO 100 is powered on. Those skilled in the art will appreciate that while the above describes a wireless terminal 10 having only one frequency generator, the wireless terminal 10 described above may include multiple frequency generators. For example, baseband electronics 16 may include a secondary frequency generator (not shown), such as a digital PLO, that maintains the clock signal while the wireless terminal 10 is in a sleep mode. When wireless terminal 10 wakes up from the sleep mode, the secondary frequency generator is disabled to enable the primary frequency generator 100 to take over the responsibility of providing the desired frequency and clock signal to the RF and baseband electronics 14, 16. The present invention is particularly beneficial for these types of multiple frequency generator systems because short start-up times reduce the likelihood that wireless terminal 10 will lose clock during the transition from the secondary frequency generator to the primary frequency generator.

In addition to the advantages mentioned above, the VCXO 100 of the present invention provides several advantages over conventional VCXOs 100. First, by using voltage controller 110 to sink the current generated by start-up controller 130, the present invention avoids adding multiple shunt elements to the tank network 122. As a result, the fast start network 134 is the only extra tank network 122 connection point. This helps to maintain a high overall tank network "Q", which helps maintain the desired phase noise associated with the oscillator 120. Further, because the start-up controller 130 uses very little bias current (typically on the order of 300–500 $\mu$A), start-up controller 130 does not significantly impact the DC current consumption of the VCXO 100. In fact, depending on the VCXO phase noise and any output amplitude requirements of the start-up controller 130 of the present invention may help reduce the overall DC bias current of the wireless terminal 10. Further still, because start-up controller 130 bypasses the conventional start-up issues associated with a VCXO, the present invention effectively removes the impact of the relationship between the tuning range and the duration of the start-up mode. As a result, the VCXO 100 of the present invention enables flexible tuning range and DC bias current options, which saves development time and money.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A voltage controlled oscillator in a wireless terminal comprising:
    an oscillator to generate a reference frequency based on a variable voltage applied to an input node of the oscillator; and
    a start-up controller operatively connected to the oscillator to apply a temporary bias voltage to the oscillator input node to reduce a start-up time of the voltage controlled oscillator by reducing a capacitance associated with the oscillator.

2. The voltage controlled oscillator of claim 1 wherein the start-up controller comprises:
    a detector that generates a control signal upon sensing the presence of an oscillator output voltage; and
    a fast start network operatively connected to the detector that applies the temporary bias voltage to the oscillator input node responsive to the detector control signal.

3. The voltage controlled oscillator of claim 2 wherein the fast start network comprises:
    a voltage source to supply the temporary bias voltage; and a switch to selectively connect the voltage source to the oscillator input node in response to the detector control signal.

4. The voltage controlled oscillator of claim 3 wherein the switch selectively disconnects the voltage source from the oscillator input node when the detector senses that the oscillator output voltage meets or exceeds a threshold.

5. The voltage controlled oscillator of claim 4 wherein the threshold comprises a variable threshold.

6. The voltage controlled oscillator of claim 4 wherein the threshold is defined as a predetermined percentage of oscillator output voltage.

7. The voltage controlled oscillator of claim 6 wherein the threshold is defined as 90% of the oscillator output voltage.

8. The voltage controlled oscillator of claim 3 wherein the switch selectively disconnects the voltage source from the oscillator input node responsive to the expiration of a predetermined time period.

9. The voltage controlled oscillator of claim 8 wherein the fast start network includes a resistor and a capacitor and wherein a time constant based on the resistor and the capacitor defines the predetermined time period.

10. The voltage controlled oscillator of claim 1 wherein the oscillator comprises a tank network and an active oscillator core and wherein the start-up controller applies the temporary bias voltage to the tank network.

11. The voltage controlled oscillator of claim 10 wherein the tank network comprises a varactor diode and wherein the start-up controller applies the temporary bias voltage to the varactor diode.

12. The voltage controlled oscillator of claim 1 further comprising a voltage controller operatively connected to the oscillator to apply the variable voltage to the oscillator.

13. The voltage controlled oscillator of claim 12 wherein the voltage controller sinks current generated by the start-up controller during the start-up time.

14. The voltage controlled oscillator of claim 1 wherein the voltage controlled oscillator comprises a voltage controlled crystal oscillator.

15. The voltage controlled oscillator of claim 1 wherein the voltage controlled oscillator is disposed in a cellular telephone.

16. A method of operating a voltage controlled oscillator in a wireless terminal comprising:
sensing that the voltage controlled oscillator is powered on;
applying a temporary bias voltage to an oscillator input node to reduce a start-up time associated with the voltage controlled oscillator by reducing an initial capacitance associated with the oscillator input node; and
removing the temporary bias voltage from the oscillator input node responsive to the voltage controlled oscillator meeting a predetermined operating condition.

17. The method of claim 16 wherein applying the temporary bias voltage to the oscillator input node comprises selectively connecting a voltage source to the oscillator input node.

18. The method of claim 16 wherein removing the temporary bias voltage from the oscillator input node responsive to the voltage controlled oscillator meeting a predetermined operating condition comprises removing the temporary bias voltage from the oscillator input node responsive to the voltage controlled oscillator sensing that an oscillator output voltage meets or exceeds an operating threshold.

19. The method of claim 16 wherein removing the temporary bias voltage from the oscillator input node responsive to the voltage controlled oscillator meeting the predetermined operating condition comprises removing the temporary bias voltage from the oscillator input node after the expiration of a predetermined time period.

20. The method of claim 19 wherein the predetermined time period is defined by a resistor-capacitor time constant associated with the voltage controlled oscillator.

21. The method of claim 16 wherein the oscillator comprises a tank network and wherein applying the temporary bias voltage to the oscillator input node comprises applying the temporary bias voltage to the tank network.

22. The method of claim 16 further comprising sinking current associated with the bias voltage in a voltage controller until the voltage controlled oscillator meets the predetermined operating condition.

23. The method of claim 16 wherein the voltage controlled oscillator comprises a voltage controlled crystal oscillator.

24. The method of claim 16 wherein the voltage controlled oscillator is disposed in a cellular telephone.

25. A method of reducing a start-up time associated with an oscillator circuit comprising:
detecting that the oscillator circuit has been powered on by sensing the presence of an oscillator output voltage; and
applying a temporary bias voltage to the oscillator circuit to reduce a start-up time associated with the oscillator circuit by reducing a capacitance of the oscillator circuit.

26. The method of claim 25 wherein applying the temporary bias voltage to the oscillator circuit comprises selectively connecting a voltage source to an input node of the oscillator circuit.

27. The method of claim 25 further comprising sinking current associated with the temporary bias voltage in a voltage controller.

28. The method of claim 25 further comprising removing the temporary bias voltage from the oscillator circuit responsive to sensing that the oscillator output voltage meets or exceeds an operating threshold.

29. The method of claim 28 wherein the operating threshold is defined as a predetermined percentage of the oscillator output voltage.

30. The method of claim 29 wherein the operating threshold is defined as 90% of the oscillator output voltage.

31. The method of claim 25 further comprising removing the temporary bias voltage from the oscillator circuit after the expiration of a predetermined time period.

32. The method of claim 31 wherein the predetermined time period is defined by a resistor-capacitor time constant.

33. The method of claim 25 wherein the oscillator circuit comprises a tank network and wherein applying the temporary bias voltage to the oscillator circuit comprises applying the temporary bias voltage to the tank network.

34. The method of claim 25 wherein the oscillator circuit comprises a voltage controlled crystal oscillator.

35. The method of claim 25 wherein the oscillator circuit is disposed in a wireless terminal.

36. A start-up controller for reducing a start-up time associated with an oscillator circuit, the start-up controller comprising:
a detector circuit to generate a control signal upon sensing the presence of an oscillator output voltage; and
a fast start network to apply a temporary bias voltage to an input node of the oscillator circuit in response to the detector control signal to reduce a start-up time associated with the oscillator circuit by reducing a capacitance associated with the oscillator input node.

37. The start-up controller of claim 36 wherein the fast start network comprises:
   a voltage source to supply the temporary bias voltage; and
   a switch operatively connected to the detector circuit to selectively connect the voltage source to the oscillator input node in response to the detector control signal.

38. The start-up controller of claim 37 wherein the switch selectively disconnects the voltage source from the oscillator input node when the detector senses that the oscillator output voltage meets or exceeds an operating threshold.

39. The start-up controller of claim 38 wherein the operating threshold comprises a variable threshold.

40. The start-up controller of claim 39 wherein the operating threshold is defined as a predetermined percentage of the oscillator output voltage.

41. The start-up controller of claim 40 wherein the operating threshold is defined as 90% of the oscillator output voltage.

42. The start-up controller of claim 37 wherein the switch selectively disconnects the voltage source from the oscillator input node responsive to the expiration of a predetermined time period.

43. The start-up controller of claim 42 wherein the predetermined time period is defined based on a resistor-capacitor time constant associated with the fast start network.

44. The start-up controller of claim 36 wherein the oscillator circuit comprises a voltage controlled crystal oscillator.

* * * * *